United States Patent
Lin et al.

(10) Patent No.: US 9,645,894 B2
(45) Date of Patent: May 9, 2017

(54) DATA STORAGE DEVICE AND FLASH MEMORY CONTROL METHOD

(71) Applicant: Silicon Motion, Inc., Jhubei, Hsinchu County (TW)

(72) Inventors: Chien-Cheng Lin, Yilan (TW);
Chia-Chi Liang, Taichung (TW);
Chang-Chieh Huang, Zhubei (TW);
Jie-Hao Lee, Kaohsiung (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 167 days.

(21) Appl. No.: 14/534,535

(22) Filed: Nov. 6, 2014

(65) Prior Publication Data

US 2015/0186224 A1    Jul. 2, 2015

Related U.S. Application Data (60) Provisional application No. 61/920,830, filed on Dec. 26, 2013.

(51) Int. Cl.
*G06F 11/00*    (2006.01)
*G06F 11/14*    (2006.01)
(Continued)

(52) U.S. Cl.
CPC ........ *G06F 11/1469* (2013.01); *G06F 3/0604* (2013.01); *G06F 3/0652* (2013.01); *G06F 3/0679* (2013.01); *G06F 11/1072* (2013.01); *G06F 12/0246* (2013.01); *G06F 12/121* (2013.01); *G11C 29/52* (2013.01);
(Continued)

(58) Field of Classification Search
CPC combination set(s) only.
See application file for complete search history.

(56) References Cited

U.S. PATENT DOCUMENTS 6,895,490 B1    5/2005  Moore et al.
6,970,890 B1 *  11/2005 Bruce ................. G06F 11/1435
(Continued)

FOREIGN PATENT DOCUMENTS

TW    201142589    12/2011
TW    201305817    2/2013
(Continued)

OTHER PUBLICATIONS

Non-Final Office Action mailed Apr. 18, 2016, issued in U.S. Appl. No. 14/534,488.
(Continued)

*Primary Examiner* — Amine Riad
(74) *Attorney, Agent, or Firm* — McClure, Qualey & Rodack, LLP (57) ABSTRACT

A data storage device and a flash memory control method with a power recovery design. A microcontroller is configured to allocate a flash memory to provide a first block from the blocks to work as a run-time write block for reception of write data. During a power recovery process due to an unexpected power-off event that interrupted write operations on the first block, the microcontroller is configured to allocate the flash memory to provide a second block from the blocks for complete data recovery of the first block and to replace the first block as the run-time write block.

12 Claims, 5 Drawing Sheets

(51) Int. Cl.
*G06F 12/02* (2006.01)
*G06F 3/06* (2006.01)
*G06F 11/10* (2006.01)
*G11C 29/52* (2006.01)
*G06F 12/121* (2016.01)
*G11C 29/04* (2006.01)

(52) U.S. Cl.
CPC .. *G06F 2212/1032* (2013.01); *G06F 2212/69* (2013.01); *G06F 2212/7201* (2013.01); *G06F 2212/7202* (2013.01); *G06F 2212/7203* (2013.01); *G06F 2212/7209* (2013.01); *G11C 2029/0411* (2013.01); *Y02B 60/1225* (2013.01)

(56) References Cited

U.S. PATENT DOCUMENTS

| | | | |
|---|---|---|---|
| 6,988,175 B2* | 1/2006 | Lasser | G11C 16/34 365/228 |
| 7,603,525 B2 | 10/2009 | Lasser | |
| 7,886,108 B2 | 2/2011 | Lee et al. | |
| 7,904,635 B2* | 3/2011 | Deng | G06F 11/1441 711/103 |
| 8,078,794 B2 | 12/2011 | Lee et al. | |
| 8,352,706 B2 | 1/2013 | Yano et al. | |
| 8,688,894 B2 | 4/2014 | Kuehne | |
| 9,311,006 B2* | 4/2016 | Moshayedi | G06F 11/1441 |
| 9,355,028 B2 | 5/2016 | Cheng | |
| 2003/0163630 A1* | 8/2003 | Aasheim | G06F 12/0246 711/103 |
| 2004/0268063 A1* | 12/2004 | Lasser | G11C 16/34 711/154 |
| 2006/0282644 A1 | 12/2006 | Wong | |
| 2007/0021963 A1 | 1/2007 | Deng et al. | |
| 2008/0104309 A1 | 5/2008 | Cheon et al. | |
| 2008/0126680 A1 | 5/2008 | Lee et al. | |
| 2008/0215800 A1 | 9/2008 | Lee et al. | |
| 2009/0144501 A2 | 6/2009 | Yim et al. | |
| 2009/0172262 A1* | 7/2009 | Olbrich | G06F 13/1657 711/103 |
| 2009/0240871 A1 | 9/2009 | Yano et al. | |
| 2009/0240873 A1 | 9/2009 | Yu et al. | |
| 2009/0327589 A1* | 12/2009 | Moshayedi | G06F 11/1441 711/103 |
| 2009/0327591 A1 | 12/2009 | Moshayedi | |
| 2009/0327840 A1* | 12/2009 | Moshayedi | G06F 11/1441 714/773 |
| 2010/0082883 A1 | 4/2010 | Chen et al. | |
| 2010/0169551 A1 | 7/2010 | Yano et al. | |
| 2010/0174851 A1 | 7/2010 | Leibowitz et al. | |
| 2010/0306451 A1 | 12/2010 | Johnson | |
| 2011/0055458 A1 | 3/2011 | Kuehne | |
| 2011/0289255 A1 | 11/2011 | Wang et al. | |
| 2012/0239862 A1 | 9/2012 | Seo et al. | |
| 2012/0297121 A1 | 11/2012 | Gorobets et al. | |
| 2012/0311245 A1 | 12/2012 | Yano et al. | |
| 2013/0304975 A1 | 11/2013 | Wang et al. | |
| 2013/0326120 A1 | 12/2013 | Cheng | |
| 2013/0326169 A1 | 12/2013 | Shaharabany et al. | |
| 2014/0006898 A1 | 1/2014 | Sharon et al. | |
| 2014/0101369 A1 | 4/2014 | Tomlin et al. | |
| 2014/0122776 A1 | 5/2014 | El Maghraoui et al. | |
| 2014/0136753 A1 | 5/2014 | Tomlin et al. | |
| 2015/0261444 A1 | 9/2015 | Yoshii et al. | |

FOREIGN PATENT DOCUMENTS

| | | |
|---|---|---|
| TW | 201348958 | 12/2013 |
| TW | 201348959 | 12/2013 |

OTHER PUBLICATIONS

Non-Final Office Action dated Jun. 30, 2016, issued in U.S. Appl. No. 14/534,633.
Non-Final Office Action dated Jul. 1, 2016, issued in U.S. Appl. No. 14/534,603.
Office Action dated May 26, 2016, issued in U.S. Appl. No. 14/534,686.

* cited by examiner

DATA STORAGE DEVICE AND FLASH MEMORY CONTROL METHOD

CROSS REFERENCE TO RELATED APPLICATIONS

This application claims the benefit of U.S. Provisional Application No. 61/920,830, filed Dec. 26, 2013, the entirety of which is incorporated by reference herein.

BACKGROUND OF THE INVENTION

Field of the Invention

The present invention relates to data storage devices with flash memory and flash memory control methods.

Description of the Related Art

Flash memory, a data storage medium, is common in today's data storage devices. For example, flash memory is typically used in memory cards, USB flash devices, solid-state drives, and so on. In another application with multi-chip package technology, a NAND flash chip and a controller chip are combined in one package as an embedded multi-media card (e.g. eMMC).

A flash memory device provides storage space which is divided into blocks, and each block includes a plurality of pages. An erase operation designed for flash memory is performed on a block-by-block basis, to release space one block at a time. When updating data, the new data is written into a spare space rather than being overwritten on the old data. It is more complex to manage a flash memory rather than other conventional storage mediums, especially if an unexpected power-off event occurred. An unexpected power-off event may damage a run-time write block (for reception of write data) of a flash memory.

Furthermore, for the convenient management of the flash memory, the physical-to-logical address mapping information of each block is dynamically collected in a volatile memory (e.g., an SRAM). The physical-to-logical address mapping information dynamically collected in the volatile memory has to be uploaded to the flash memory for non-volatile storage. It can be very tricky to determine when and how the mapping information uploading is performed.

BRIEF SUMMARY OF THE INVENTION

A data storage device in accordance with an exemplary embodiment of the disclosure includes a flash memory and a control unit. The flash memory is divided into a plurality of blocks with each block comprising a plurality of pages. The control unit couples the flash memory to a host and has a microcontroller. The microcontroller is configured to allocate the flash memory to provide a first block from the blocks to work as a run-time write block for reception of write data. Furthermore, during a power recovery process due to an unexpected power-off event that interrupted write operations on the first block, the microcontroller is configured to allocate the flash memory to provide a second block from the blocks for complete data recovery of the first block and to replace the first block as the run-time write block.

In an exemplary embodiment, the control unit further comprises a random access memory. The microcontroller is configured to establish a physical-to-logical address mapping table in the random access memory to record logical addresses corresponding to physical addresses of a table-outdated block between the blocks of the flash memory. The microcontroller is configured to allocate the flash memory to provide the first block as the run-time write block when finishing the writing of the table-outdated block. The microcontroller is configured to update a logical-to-physical address mapping table in accordance with the physical-to-logical address mapping table at intervals between write operations on the run-time write block. The logical-to-physical address mapping table is provided within the flash memory. In an exemplary embodiment, the microcontroller is configured to allocate the flash memory to provide the first block as the run-time write block when the table-outdated block is full. In another exemplary embodiment, the microcontroller is configured to allocate the flash memory to provide the first block as the run-time write block during a power recovery process due to an unexpected power-off event that interrupted write operations on the table-outdated block.

A flash memory control method in accordance with an exemplary embodiment of the disclosure includes the following steps: allocating a flash memory to provide a first block from a plurality of blocks of the flash memory to work as a run-time write block for reception of write data; and, during a power recovery process due to an unexpected power-off event that interrupted write operations on the first block, allocating the flash memory to provide a second block from the blocks for complete data recovery of the first block and to replace the first block as the run-time write block.

In an exemplary embodiment, the flash memory control method further comprises the following steps: establishing a physical-to-logical address mapping table in a random access memory to record logical addresses corresponding to physical addresses of a table-outdated block between the blocks of the flash memory; allocating the flash memory to provide the first block as the run-time write block when finishing the writing of the table-outdated block; and updating a logical-to-physical address mapping table in accordance with the physical-to-logical address mapping table at intervals between write operations on the run-time write block, wherein the logical-to-physical address mapping table is provided within the flash memory.

In an exemplary embodiment, the flash memory is allocated to provide the first block as the run-time write block when the table-outdated block is full. In another exemplary embodiment, the flash memory is allocated to provide the first block as the run-time write block during a power recovery process due to an unexpected power-off event that interrupted write operations on the table-outdated block.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
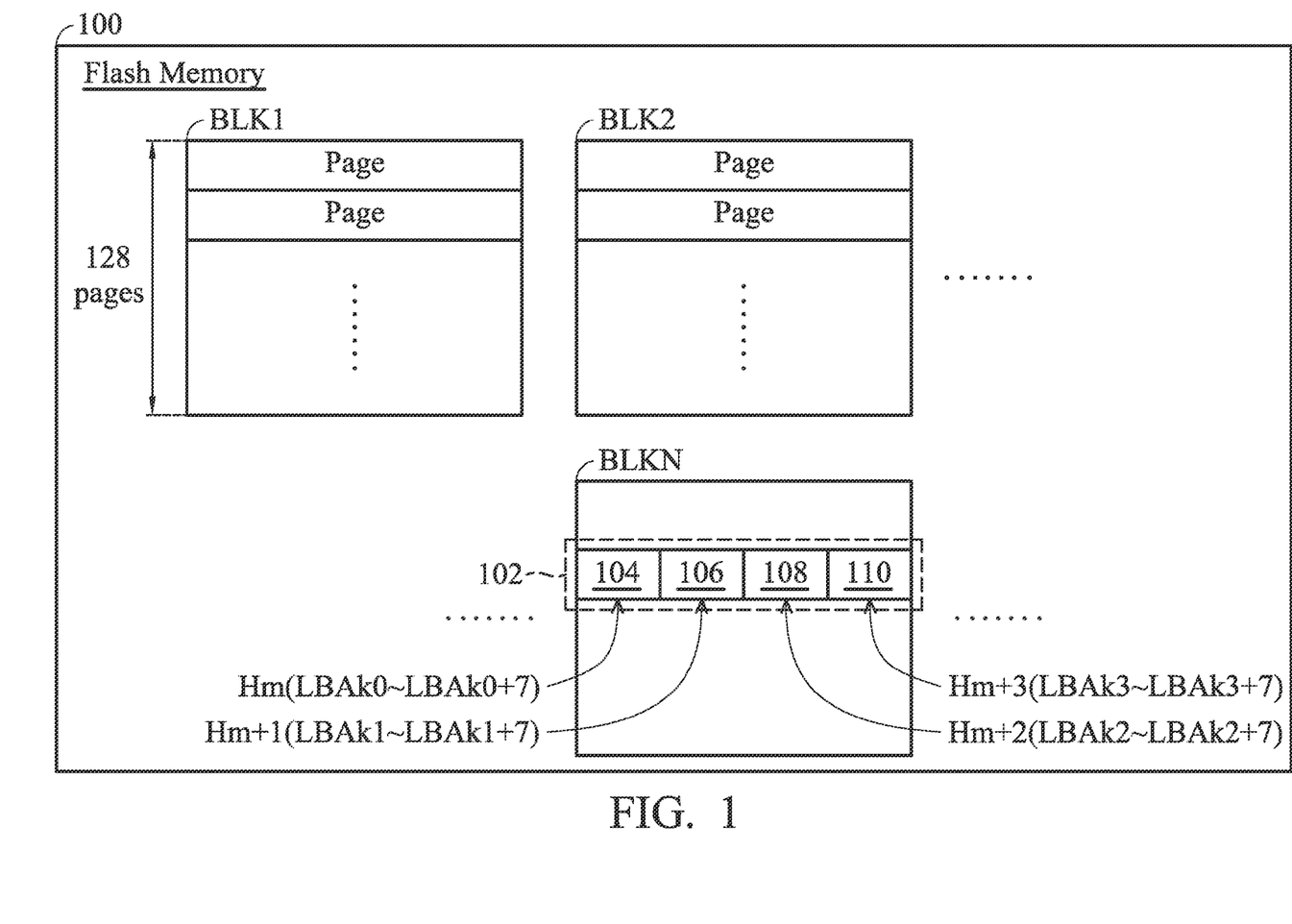
FIG. 1 depicts a storage space provided by a flash memory 100.

FIG. 1 depicts a storage space provided by a flash memory 100. The storage space provided by the flash memory 100 is divided into blocks (e.g., BLK1, BLK2 . . . BLKN . . . ). Each block includes a plurality of physical pages. Each physical page includes a plurality of sectors. For example, physical page 102 provided within block BLKN includes four sectors 104, 106, 108 and 110. When each sector is allocated for the storage of the user data of one host page (corresponding to a series of logical addresses, e.g. LBAk to LBAk+7), each physical page stores four host pages. For example, the four sectors 104, 106, 108 and 110 correspond to four host pages Hm (i.e. from LBAk0 to LBAk0+7), Hm+1 (i.e. from LBAk1 to LBAk1+7), Hm+2 (i.e. from LBAk2 to LBAk2+7) and Hm+3 (i.e. from LBAk3 to LBAk3+7), respectively. When one block contains 128 physical pages, there are 128×4 host pages corresponding to the 128×4 sectors of the block. For each block, the mapping information between the 128×4 sectors and the 128×4 host pages has to be recorded for storage space management. Timely updating the considerable quantity of mapping information is very tricky.

Figure 2:
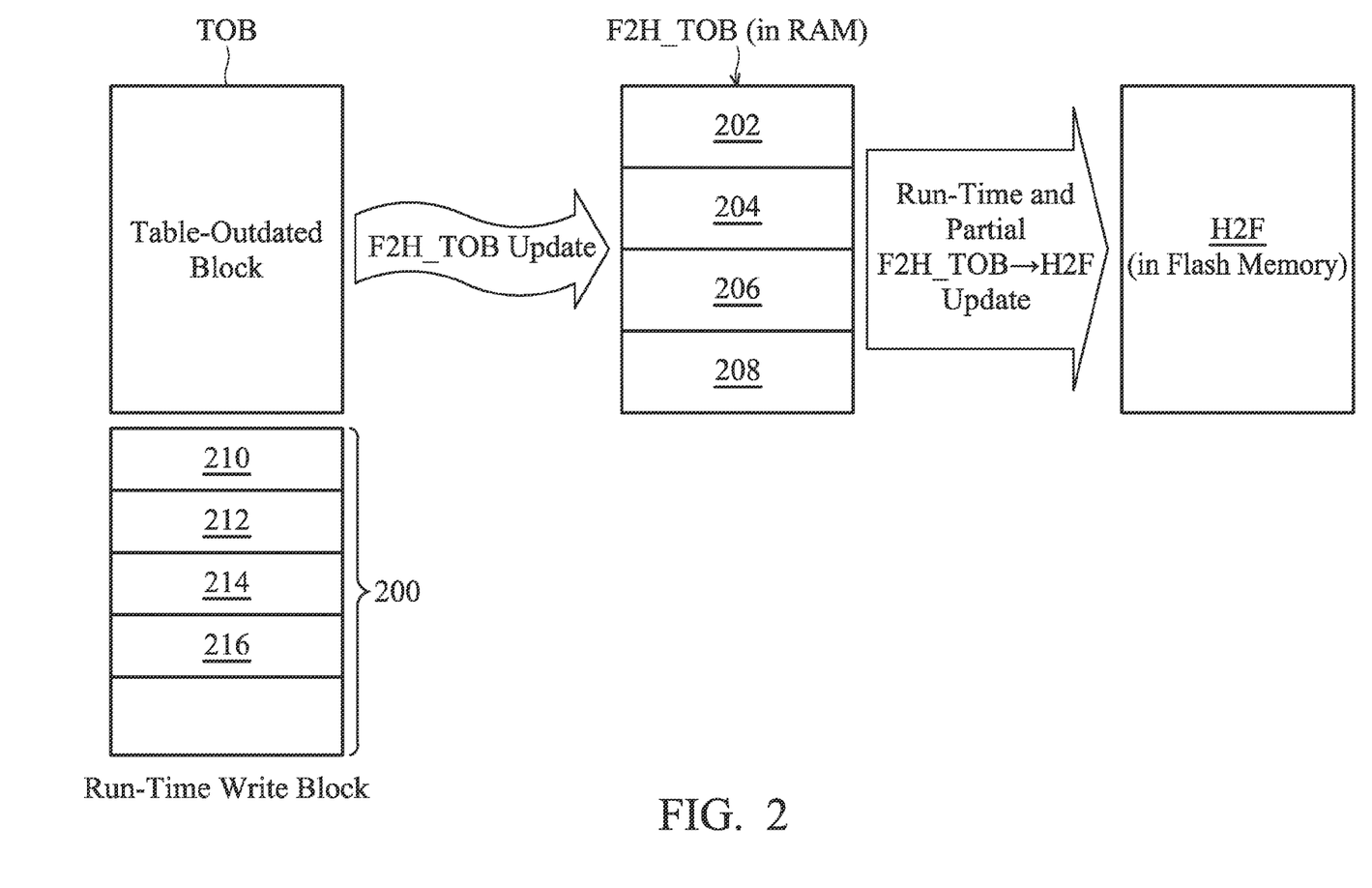
FIG. 2 depicts a run-time and partial F2H_TOB→H2F update in accordance with an exemplary embodiment of the disclosure, wherein a table-outdated block TOB is introduced.

FIG. 2 depicts a run-time and partial F2H_TOB→H2F update in accordance with an exemplary embodiment of the disclosure, wherein the idea of a table-outdated block TOB is introduced. Formerly the table-outdated block TOB was allocated for reception of write data. A physical-to-logical address mapping table F2H_TOB about the table-outdated block TOB is dynamically updated in a random access memory. When finishing the writing of the former run-time write block (i.e. the table-outdated block TOB), another spare block 200 is allocated as a new run-time write block. At intervals between write operations on the new run-time write block 200, a logical-to-physical address mapping table H2F (provided within the flash memory for non-volatile storage) is updated in accordance with the physical-to-logical address mapping table F2H_TOB. For example, during the time interval (longer than twice the time-out period) between the write operation on space 210 and the write operation on space 212, the logical-to-physical address mapping table H2F is first updated in accordance with the F2H_TOB information 202 and then updated in accordance with the F2H_TOB information 204. During the time interval (longer than the time-out period but shorter than twice the time-out period) between the write operation on space 212 and the write operation on space 214, the logical-to-physical address mapping table H2F is updated in accordance with the F2H_TOB information 206. During the time interval (longer than the time-out period but shorter than twice the time-out period) between the write operation on space 214 and the write operation on space 216, the logical-to-physical address mapping table H2F is updated in accordance with the F2H_TOB information 208. In this manner, the physical-to-logical address mapping table F2H_TOB with considerable quantity is used in updating the logical-to-physical address mapping table H2F in the flash memory section by section without occupying system resources.

In an exemplary embodiment, the flash memory is allocated to provide the block 200 as the run-time write block when the former run-time write block (i.e. the table-outdated block TOB) is full. In another exemplary embodiment, the flash memory is allocated to provide the block 200 as the run-time write block during a power recovery process due to an unexpected power-off event that interrupted write operations on the former run-time write block (i.e. the table-outdated block TOB). Note that in the power recovery process due to the unexpected power-off event that interrupted write operations on the former run-time write block (i.e. the table-outdated block TOB), the physical-to-logical address mapping table F2H_TOB has to be restored into the random access memory. Thus, the logical-to-physical address mapping table H2F is updated in accordance with the restored physical-to-logical address mapping table F2H_TOB at intervals between write operations on the run-time write block 200.

However, an unexpected power-off event may also occur to interrupt write operations on the run-time write block 200. A power recovery process for an unexpected power-off event that interrupted write operations on the run-time write block 200 is discussed in the following paragraphs.

Figure 3:
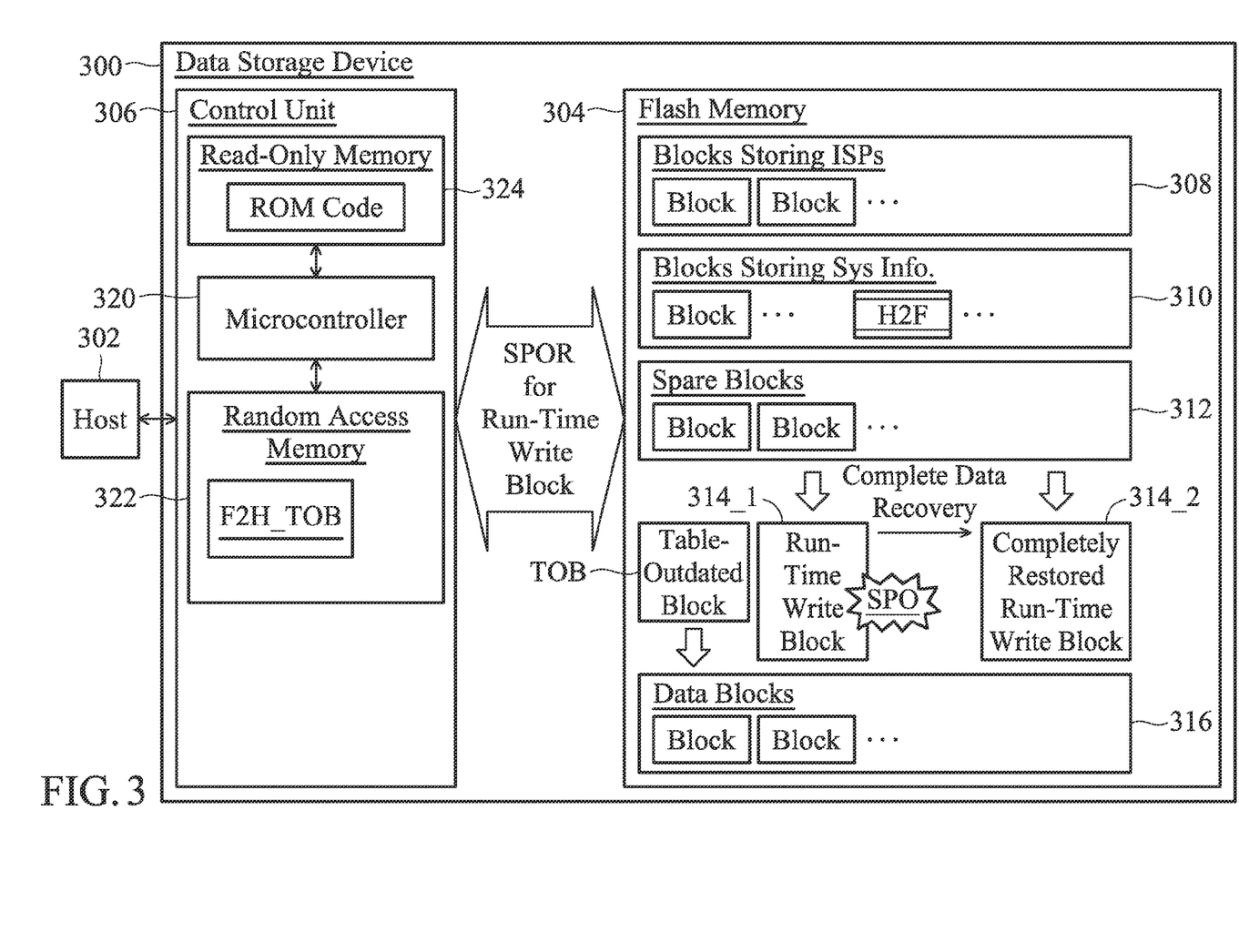
FIG. 3 is a block diagram depicting a data storage device 300 in accordance with an exemplary embodiment of the disclosure.

FIG. 3 is a block diagram depicting a data storage device 300 in accordance with an exemplary embodiment of the disclosure. The data storage device 300, operating in accord with commands from the host 302, includes a flash memory 304 and a control unit 306. In the flash memory 304, the blocks are allocated for several purposes. Blocks 308 are stored with in-system programs (ISPs). Blocks 310 store system information. Blocks 312 are spare blocks. A block 314_1, allocated from the spare blocks 312, works as a run-time write block for reception of write data. Meanwhile, the former run-time write block is regarded as a table-outdated block TOB, which will be pushed into the data pool 316 as a data block. The flash memory 304 may further contain free blocks not shown in the figure.

The control unit 306 couples the flash memory 304 to the host 302 and comprises a microcontroller 320, a random access memory 322 and a read-only memory 324. A ROM code is stored in the read-only memory 324. The microcontroller 320 operates the flash memory 304 by executing the ROM code stored in the read-only memory 324 or/and by executing the ISPs stored in the blocks 308 of the flash memory 304. The microcontroller 320 is configured to perform the block allocation of the flash memory 304 (as shown in FIG. 3) and establish a physical-to-logical address mapping table F2H_TOB in the random access memory 322 for the table-outdated block TOB and provide a logical-to-physical address mapping table H2F in the flash memory 304 (e.g., recorded by the system info blocks 310). The physical-to-logical address mapping table F2H_TOB is established in the random access memory 322 to dynamically record logical addresses corresponding to physical addresses of the table-outdated block TOB. The logical-to-physical address mapping table H2F is provided within the flash memory 304 for non-volatile storage of mapping information. Instead of updating the logical-to-physical address mapping table H2F in accordance with the entire physical-to-logical address mapping table F2H_TOB at one time, the microcontroller 320 is configured to update the logical-to-physical address mapping table H2F in accordance with the physical-to-logical address mapping table F2H_TOB section by section. This means that between two write operations on the run-time write block 314_1, just part of the physical-to-logical address mapping table F2H_TOB is used in updating the logical-to-physical address mapping table H2F. The action to update the logical-to-physical address mapping table H2F in accordance with the physical-to-logical address mapping table F2H_TOB is named "F2H_TOB→H2F update (sealing)." The microcontroller 320 is configured to perform a run-time (i.e. between two write operations on the run-time write block 314_1) and partial (i.e. just part of the physical-to-logical address mapping table F2H_TOB) F2H_TOB→H2F update, considerably improving the system efficiency of the data storage device 300.

If an unexpected power-off event SPO was occurred and interrupted write operations on the block 314_1, a specific power-recovery process (e.g. an SPOR (abbreviated from "Sudden Power-Off Recovery") process) is called for. During a power recovery process (SPOR) for the unexpected power-off event SPO that interrupted write operations on the block 314_1, the microcontroller 320 is configured to allocate the flash memory 304 to provide a block 314_2 from the spare blocks 312 for complete data recovery of the block 314_1 and to replace the block 314_1 as the run-time write block. Note that during the power recovery process (SPOR) due to the unexpected power-off event SPO that interrupted write operations on the block 314_1, the microcontroller 320 may restore the physical-to-logical mapping table F2H_TOB into the random access memory 322 based on physical-to-logical mapping information contained in the table-outdated block TOB if there remains any mapping information that has not been updated to the logical-to-physical address mapping table H2F. After the data of block 314_1 is finished being restored in the block 314_2, the remaining mapping information may be used in updating the logical-to-physical address mapping table H2F between the subsequent write operations on the block 314_2. In an exemplary embodiment, the microcontroller 320 is configured to perform the complete data recovery from the block 314_1 to the block 314_2 based on an error checking and correction (ECC) algorithm.

Figure 4:
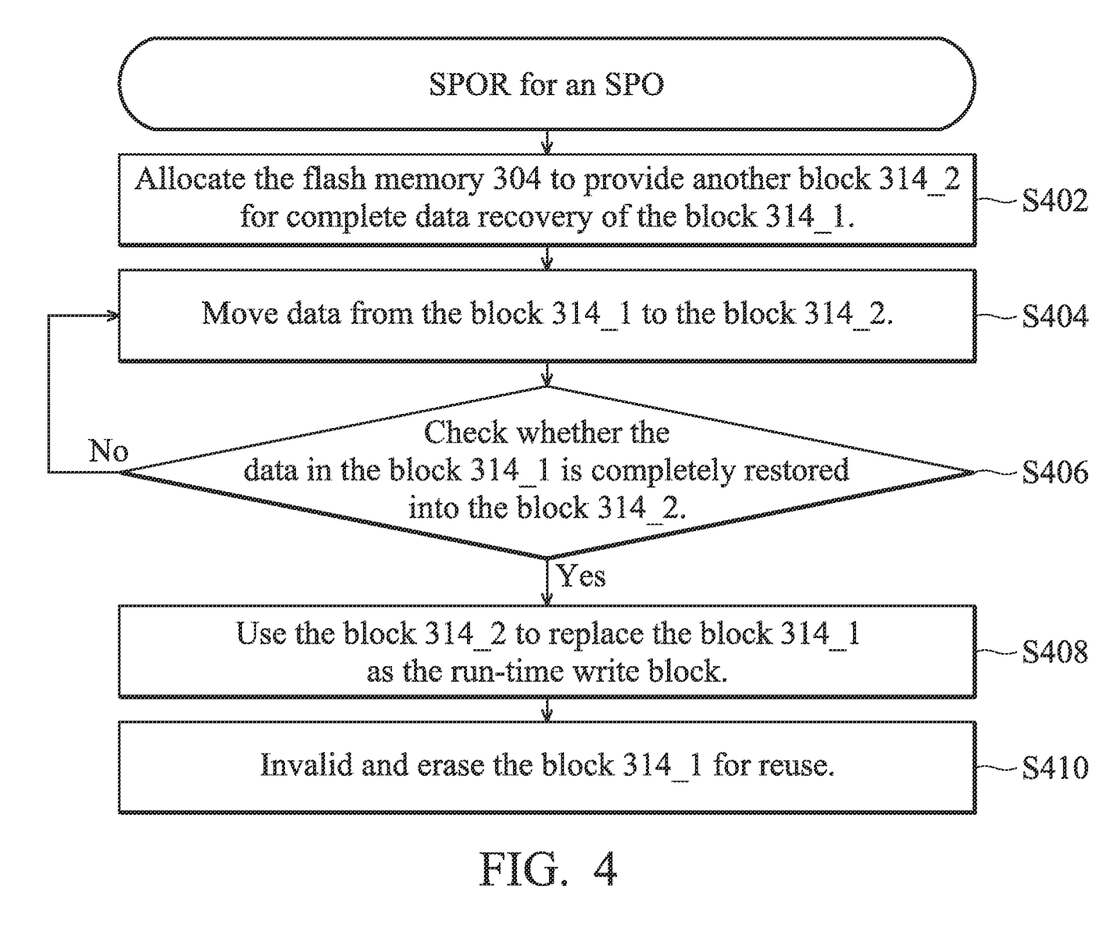
FIG. 4 is a flowchart depicting the power recovery process (SPOR) for the unexpected power-off event SPO that interrupted write operations on the block 314_1.

FIG. 4 is a flowchart depicting the power recovery process (SPOR) for the unexpected power-off event SPO that interrupted write operations on the block 314_1 (that works as a run-time write block). In step S402, the flash memory 304 is allocated to provide another block 314_2 for complete data recovery of the block 314_1. In step S404, a data recovery is performed based on an error checking and correction algorithm (e.g. an ecc algorithm) to move data from block 314_1 to block 314_2. In step S406, it is checked whether the data in the block 314_1 is completely restored into the second block 314_2. If not, the data recovery process in step S404 is repeated. If yes, step S408 is performed to use the block 314_2 to replace the block 314_1 as the run-time write block. In step S410, the block 314_1 is labeled as an invalid block and is erased for reuse.

Figure 5:
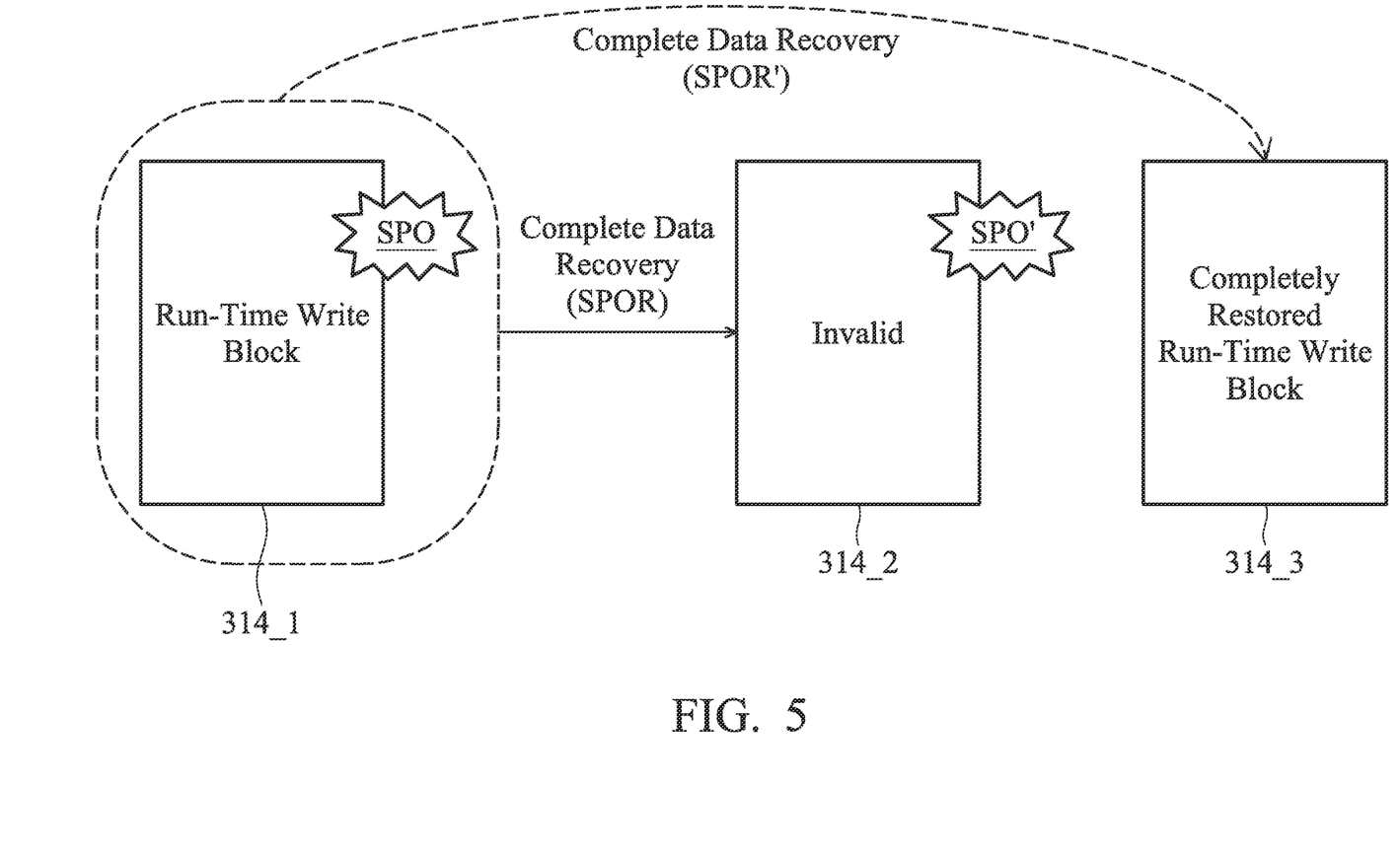
FIG. 5 shows that once the unexpected power-off event repeats, the complete data recovery of the run-time write block is repeated, too.

FIG. 5 shows that, once the unexpected power-off event repeats, the complete data recovery of the run-time write block is repeated, too. As shown, initially, data is written into block 314_1, which works as a run-time write block. Then, the write operations on the block 314_1 are interrupted by the unexpected power-off event SPO. Thus, during the power recovery process SPOR due to the unexpected power-off event SPO, the flash memory 304 is allocated to provide the block 314_2 for complete data recovery of the block 314_1. However, another unexpected power-off event SPO' occurs and the write operations on the block 314_2 are interrupted. During a power recovery process SPOR' due to the unexpected power-off event SPO', the block 314_2 is labeled invalid and the flash memory 304 is allocated to provide a third block 314_3 from the blocks for complete data recovery of the block 314_1 and to replace the block 314_2 as the run-time write block.

In this manner, even though the unexpected power-off events repeats, the data of the run-time write block is completely recovered in a single block rather than being divided into sections and scattered over several blocks.

Any technique using the aforementioned concept to control a flash memory is within the scope of the invention. The invention further involves flash memory control methods, which are not limited to any specific controller architecture.

While the invention has been described by way of example and in terms of the embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, divided into a plurality of blocks with each block comprising a plurality of pages; and
a control unit, coupling the flash memory to a host and comprising a microcontroller,
wherein the microcontroller is configured to allocate the flash memory to provide a first block from the blocks to work as a run-time write block for reception of write data and, during a power recovery process due to an unexpected power-off event that interrupted write operations on the first block, the microcontroller is configured to allocate the flash memory to provide a second block from the blocks for complete data recovery of the first block and to replace the first block as the run-time write block, wherein the microcontroller is configured to allocate the flash memory to provide the first block as the run-time write block when finishing writing of a table-outdated block between the blocks of the flash memory, the control unit further comprises a random access memory, the microcontroller is configured to establish a physical-to-logical address mapping table in the random access memory to record logical addresses corresponding to physical addresses of the table-outdated block, and the microcontroller is configured to update a logical-to-physical address mapping table in accordance with the physical-to-logical address mapping table at intervals longer than a time-out period between write operations on the run-time write block.

2. The data storage device as claimed in claim 1, wherein:
the microcontroller is configured to allocate the flash memory to provide the first block as the run-time write block when the table-outdated block is full;
and
the logical-to-physical address mapping table is provided within the flash memory.

3. The data storage device as claimed in claim 2, wherein:
between a first write operation and a second write operation on the run-time write block, the microcontroller updates the logical-to-physical address mapping table in accordance with just part of the physical-to-logical address mapping table.

4. The data storage device as claimed in claim 2, wherein:
during the power recovery process due to the unexpected power-off event that interrupted write operations on the first block, the microcontroller restores the physicalto-logical mapping table based on physical-to-logical mapping information stored in the table-outdated block.

5. The data storage device as claimed in claim 1, wherein:
during a power recovery process due to an unexpected power-off event that interrupted write operations on the second block, the microcontroller is configured to invalidate the second block and allocate the flash memory to provide a third block from the blocks for complete data recovery of the first block and to replace the first block as the run-time write block.

6. The data storage device as claimed in claim 1, wherein:
the microcontroller is configured to perform the complete data recovery of the first block based on an error checking and correction algorithm.

7. A flash memory control method, comprising:
allocating a flash memory to provide a first block from a plurality of blocks of the flash memory to work as a run-time write block for reception of write data;
during a power recovery process due to an unexpected power-off event that interrupted write operations on the first block, allocating the flash memory to provide a second block from the blocks for complete data recovery of the first block and to replace the first block as the run-time write block;
allocating the flash memory to provide the first block as the run-time write block when finishing writing of a table-outdated block between the blocks of the flash memory;
establishing a physical-to-logical address mapping table in a random access memory to record logical addresses corresponding to physical addresses of the table-outdated block; and
updating a logical-to-physical address mapping table in accordance with the physical-to-logical address mapping table at intervals longer than a time-out period between write operations on the run-time write block.

8. The flash memory control method as claimed in claim 7, further comprising:
allocating the flash memory to provide the first block as the run-time write block during a power recovery process due to an unexpected power-off event that interrupted write operations on the table-outdated block;
wherein the logical-to-physical address mapping table is provided within the flash memory.

9. The flash memory control method as claimed in claim 8, wherein:
between a first write operation and a second write operation on the run-time write block, the logical-to-physical address mapping table is updated in accordance with just part of the physical-to-logical address mapping table.

10. The flash memory control method as claimed in claim 8, wherein:
during the power recovery process due to the unexpected power-off event that interrupted write operations on the first block, the physical-to-logical mapping table is restored based on physical-to-logical mapping information stored in the table-outdated block.

11. The flash memory control method as claimed in claim 7, further comprising:
during a power recovery process due to an unexpected power-off event that interrupted write operations on the second block, invaliding the second block and allocating the flash memory to provide a third block from the blocks for complete data recovery of the first block and to replace the first block as the run-time write block.

12. The flash memory control method as claimed in claim 7, wherein:
the complete data recovery of the first block is performed based on an error checking and correction algorithm.

\* \* \* \* \*